United States Patent
Park et al.

(10) Patent No.: US 7,924,639 B2
(45) Date of Patent: Apr. 12, 2011

(54) NONVOLATILE MEMORY DEVICE USING RESISTANCE MATERIAL

(75) Inventors: Joon-min Park, Seoul (KR);
Sang-beom Kang, Hwaseong-si (KR);
Woo-yeong Cho, Suwon-si (KR);
Hyung-rok Oh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 479 days.

(21) Appl. No.: 12/031,115

(22) Filed: Feb. 14, 2008

(65) Prior Publication Data

US 2008/0198646 A1 Aug. 21, 2008

(30) Foreign Application Priority Data

Feb. 16, 2007 (KR) .................. 10-2007-0016344

(51) Int. Cl.
*G11C 7/00* (2006.01)
*G11C 29/00* (2006.01)

(52) U.S. Cl. ............. 365/200; 365/148; 365/225.7; 365/230.03

(58) Field of Classification Search ............. 365/148, 365/200, 227.7, 230.03, 225.7; 711/103, 711/219

See application file for complete search history.

(56) References Cited

U.S. PATENT DOCUMENTS

| | | | |
|---|---|---|---|
| 6,816,419 B2* | 11/2004 | Haga | 365/200 |
| 6,879,516 B2 | 4/2005 | Nejad et al. | |
| 6,882,553 B2 | 4/2005 | Nejad et al. | |
| 6,956,769 B2* | 10/2005 | Lee | 365/185.09 |
| 7,005,350 B2 | 2/2006 | Walker et al. | |
| 7,023,743 B2 | 4/2006 | Nejad et al. | |
| 7,042,749 B2 | 5/2006 | Nejad et al. | |
| 2006/0227588 A1* | 10/2006 | Ogawa et al. | 365/78 |

FOREIGN PATENT DOCUMENTS

| | | |
|---|---|---|
| JP | 2006085775 A | 3/2006 |
| JP | 2006514392 A | 4/2006 |
| KR | 1020040083525 A | 10/2004 |

* cited by examiner

*Primary Examiner* — Tuan T Nguyen
*Assistant Examiner* — Toan Le
(74) *Attorney, Agent, or Firm* — Volentine & Whitt, PLLC

(57) ABSTRACT

The present invention provides a nonvolatile memory device that uses a resistance material. The nonvolatile memory device includes: a stacked memory cell array having a plurality of memory cell layers stacked in a vertical direction, the stacked memory cell array having at least one memory cell group and at least one redundancy memory cell group; and a repair control circuit coupled to the stacked memory cell array, the repair control circuit configured to repair a defective one of the at least one memory cell group with a selected one of the at least one redundancy memory cell group. The features that enable repair improve the fabrication yield of the nonvolatile memory device.

20 Claims, 16 Drawing Sheets

NONVOLATILE MEMORY DEVICE USING RESISTANCE MATERIAL

CROSS REFERENCE TO RELATED APPLICATION

This application claims priority from Korean Patent Application No. 10-2007-0016344 filed on Feb. 16, 2007 in the Korean Intellectual Property Office, the disclosure of which is incorporated herein by reference in its entirety.

BACKGROUND OF THE INVENTION

1. Field of the Invention

The present invention relates generally to a nonvolatile memory device using a resistance material. More particularly, but not by way of limitation, the invention relates to a nonvolatile memory device having a vertically stacked memory cell array and a repair control circuit that is configured to repair one or more defective memory cells in the array.

2. Description of the Related Art

Generally, examples of a nonvolatile memory device that uses a resistance material include a resistive Random Access Memory (RRAM), a phase change RAM (PRAM), a magnetic RAM (MRAM), and the like. While a dynamic RAM (DRAM) or a flash memory stores data using an electric charge, a nonvolatile memory device that uses a resistance material stores data using a change in resistance of a variable resistive material (RRAM), a change in state of a phase change material (PRAM), such as a chalcogenide alloy, and a change in resistance of a magnetic tunnel junction (MTJ) thin film due to a magnetization state of a ferromagnetic substance (MRAM).

A resistive memory cell includes an upper electrode, a lower electrode, and a variable resistive element interposed therebetween. The resistance level of the variable resistive element varies according to a voltage applied between the upper and lower electrodes. In particular, a filament serving as a current path of a cell current is formed in the variable resistive element. A state where the filament is partially disconnected is defined as a reset state, a high-resistance state, and/or reset data (data 1). A state where the filament is connected is defined as a set state, a low-resistance state, and/or set data (data 0).

When a defect occurs in the nonvolatile memory device (hereinafter, simply referred to as a "defective memory cell"), the defective memory cell may be repaired using a redundant nonvolatile memory cell that has been prepared beforehand (hereinafter, simply referred to as a "redundancy memory cell"). For example, the defective memory cell may be repaired by replacing a word line coupled to the defective memory cell with a redundancy word line coupled to the redundancy memory cell. Alternatively, the defective memory cell may be repaired by replacing a bit line coupled to the defective memory cell with a redundancy bit line coupled to the redundancy memory cell.

Conventional repair circuits for nonvolatile memory devices are lacking in utility, however. For example, conventional repair circuits do not adequately address the needs of nonvolatile memory devices having a vertically stacked memory cell array.

SUMMARY OF THE INVENTION

According to an aspect of the present invention, there is provided a nonvolatile memory device. The nonvolatile memory device includes: a stacked memory cell array having a plurality of memory cell layers stacked in a vertical direction, the stacked memory cell array having at least one memory cell group and at least one redundancy memory cell group; and a repair control circuit coupled to the stacked memory cell array, the repair control circuit configured to repair a defective one of the at least one memory cell group with a selected one of the at least one redundancy memory cell group. The features that enable repair improve the fabrication yield of the nonvolatile memory device.

BRIEF DESCRIPTION OF THE DRAWINGS

The above and other features and advantages of the present invention will become more apparent by describing in detail preferred embodiments thereof with reference to the attached drawings in which.

DESCRIPTION OF THE PREFERRED EMBODIMENTS

Figure 1:
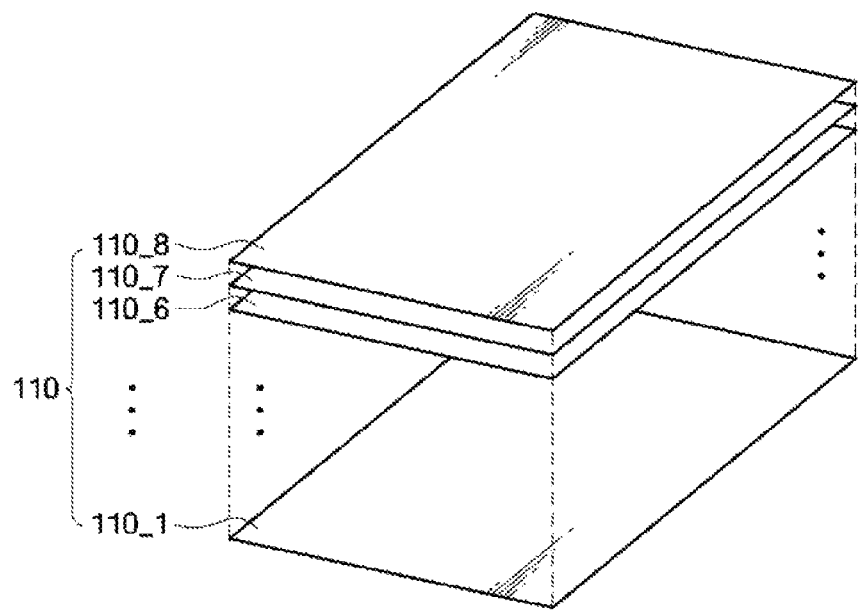
FIG. 1 is a perspective view of a nonvolatile memory device structure according to embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art, and the present invention will only be defined by the appended claims. Like reference numerals refer to like elements throughout the specification.

It will be understood that when an element or layer is referred to as being "on", "connected to", or "coupled to" another element or layer, it can be directly on, connected or coupled to the other element or layer or intervening elements or layers may be present. In contrast, when an element is referred to as being "directly on", "directly connected to", or "directly coupled to" another element or layer, there are no intervening elements or layers present. Like numbers refer to like elements throughout the specification.

It will be understood that, although the terms "first", "second", and the like are used herein to describe various elements, components, and/or sections, these elements, components, and/or sections should not be limited to the terms. The terms are only used to distinguish one element, component, or section from another element, component, or section. Thus, a first element, component, or section described below may be termed a second element, component, or section without departing from the teachings of the present invention.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

In addition, when the terms used herein are not specifically defined, all the terms used herein (including technical and scientific terms) can be understood by those skilled in the art. Further, when the general terms defined in the dictionaries are not specifically defined, the terms will have the normal meaning in the art.

Hereinafter, a description will be given for embodiments of the present invention using resistive random access memory (RRAM) devices. However, the invention can be applied to other nonvolatile memory devices that use resistance materials, such as phase change random access memory (PRAM) devices, ferroelectric RAM (FRAM) devices, magnetic RAM (MRAM) devices, and the like.

The present invention will now be described more fully with reference to the accompanying drawings, in which preferred embodiments of the present invention are shown.

Figure 2:
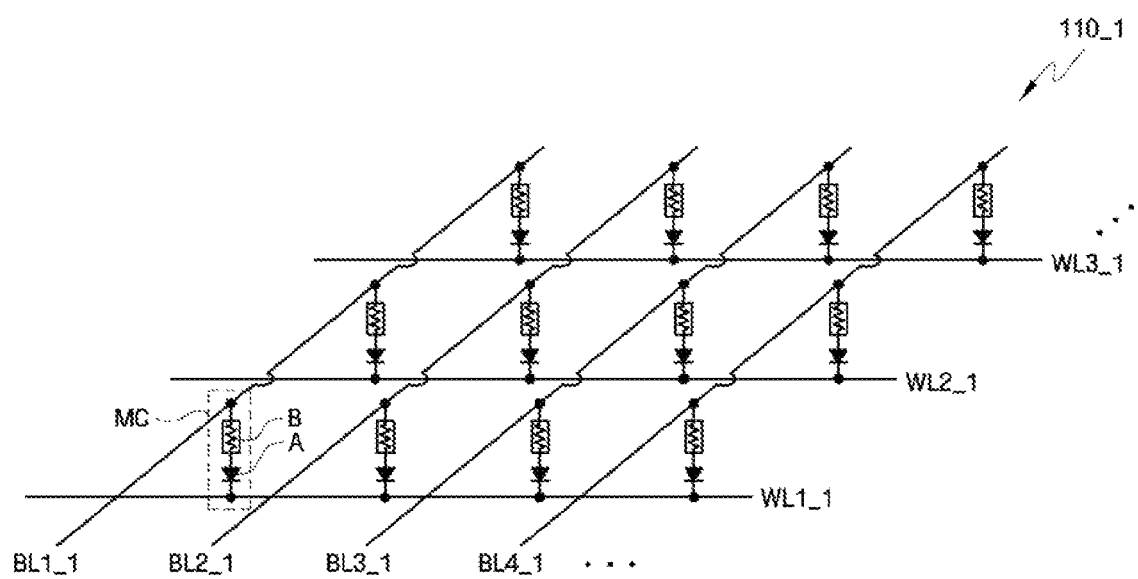
FIG. 2 is a circuit diagram of an individual layer shown in FIG. 1.
Figure 3A:
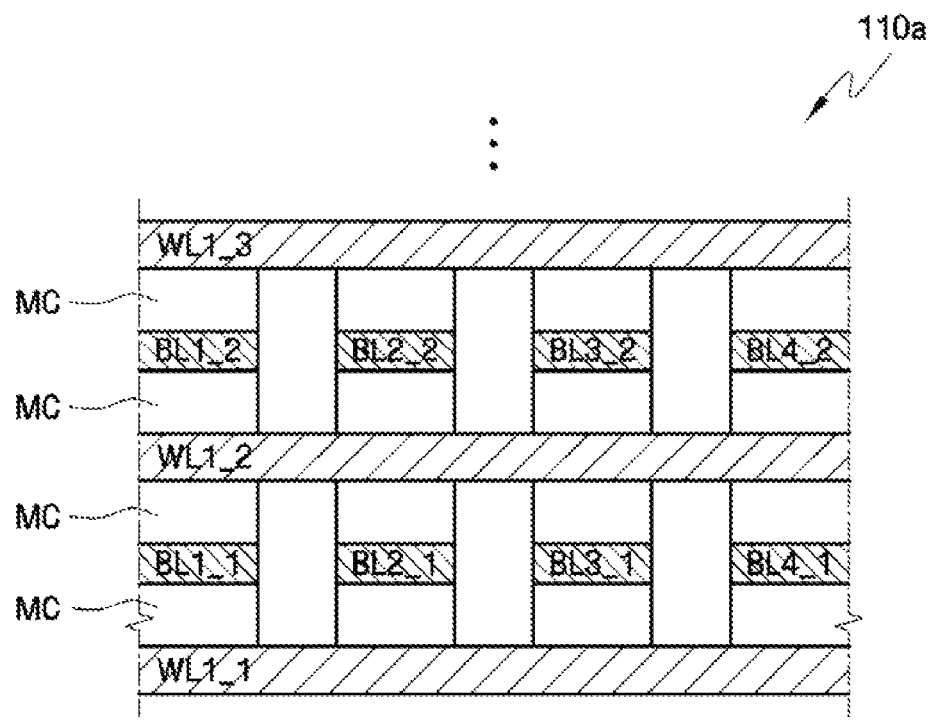
FIGS. 3A and 3B are cross-sectional views of the stacked memory cell array shown in FIG. 1.
Figure 3B:
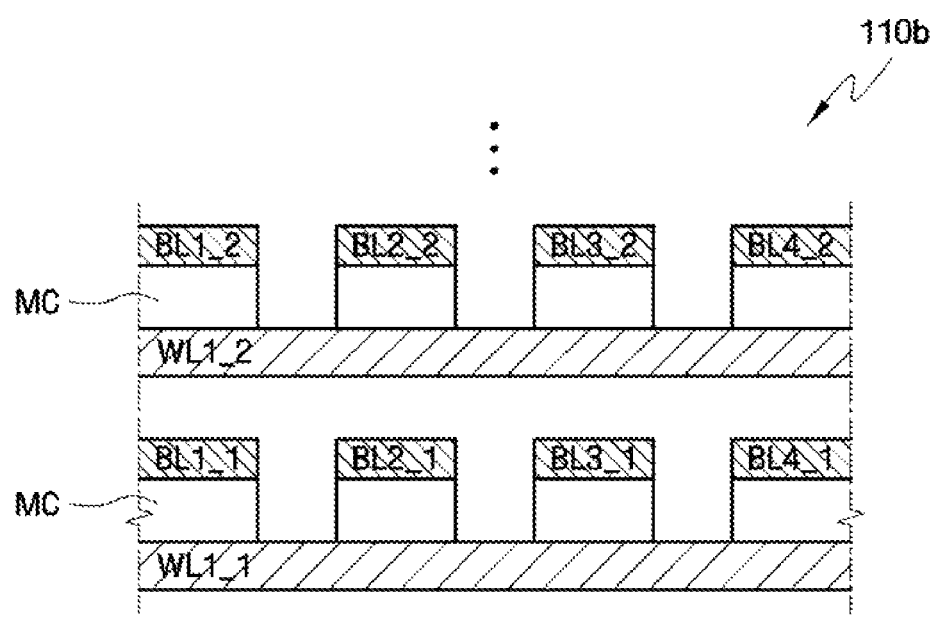

FIG. 1 is a perspective view of a nonvolatile memory device structure according to an embodiment of the present invention. FIG. 2 is a circuit diagram illustrating individual layers shown in FIG. 1 in detail. FIGS. 3A and 3B are cross-sectional views of the stacked memory cell array 110 shown in FIG. 1.

First, referring to FIG. 1, the nonvolatile memory device according to an embodiment of the present invention includes a stacked memory cell array 110.

The stacked memory cell array 110 includes multiple memory cell layers 110_1 to 110_8 that are stacked in a vertical direction. In FIG. 1, for example, eight memory cell layers 110_1 to 110_8 are stacked, but the present invention is not limited thereto. Here, each of the memory cell layers 110_1 to 110_8 may include multiple memory cell groups and/or multiple redundancy memory cell groups. That is, each of the memory cell layers 110_1 to 110_8 may include multiple memory cell groups (see FIGS. 8 and 16), multiple redundancy memory cell groups (see FIG. 8), or multiple memory cell groups and multiple redundancy memory cell groups (see FIGS. 4, 11, and 16).

As shown in FIG. 2, each of the memory cell layers 110_1 to 110_8 may have a cross point structure. Here, the cross point structure means a structure in which one memory cell is formed at an intersection between one line and another line. For convenience of explanation, in FIG. 2, the memory cell layer 110_1 is exemplified. Bit lines BL1_1 to BL4_1 extend in a first direction, word lines WL1_1 to WL3_1 extend in a second direction to cross the bit lines BL1_1 to BL4_1, and memory cells MC are formed at intersections between the bit lines BL1_1 to BL4_1 and the word lines WL1_1 to WL3_1.

The nonvolatile memory cell MC may be, for example, a resistive memory cell. In this case, the nonvolatile memory cell MC may include a variable resistive element B and an access element A, which are connected in series. The variable resistive element B may include, for example, NiO or perovskite. Perovskite may be a composition, such as manganite (for example, Pr0.7Ca0.3MnO3, Pr0.5Ca0.5MnO3, PCMO, or LCMO), titanate (for example, STO:Cr), zirconate (for example, SZO:Cr, Ca2Nb2O7:Cr, or Ta2O5:Cr), or the like. In particular, a filament is formed in the variable resistive element B, and the filament serves as a current path of a cell current that flows through the nonvolatile memory cell MC. In FIG. 2, a diode is exemplified as the access element A, but the present invention is not limited thereto.

The cross point structure will be described in detail. Each of the memory cell layers 110_1 to 110_8 may have a cross section as shown in FIG. 3A or 3B.

In FIGS. 3A and 3B, multiple word lines WL1_1 to WL1_3 and multiple bit lines BL1_1 to BL4_1 and BL2_1 to BL4_2 extend to cross each other, and nonvolatile memory cells MC are formed at intersections between the word lines and the bit lines. In structure 110a shown in FIG. 3A, adjacent nonvolatile memory cells MC in a vertical direction share the word lines WL1_1 to WL1_3 or the bit lines BL1_1 to BL4_1 and BL2_1 to BL4_2. In structure 110b shown in FIG. 3B, adjacent nonvolatile memory cells MC in the vertical direction do not share the word lines or the bit lines but are electrically isolated from each other.

Hereinafter, referring to FIGS. 4 to 7, a nonvolatile memory device according to a first embodiment of the present invention will be described.

Figure 4:
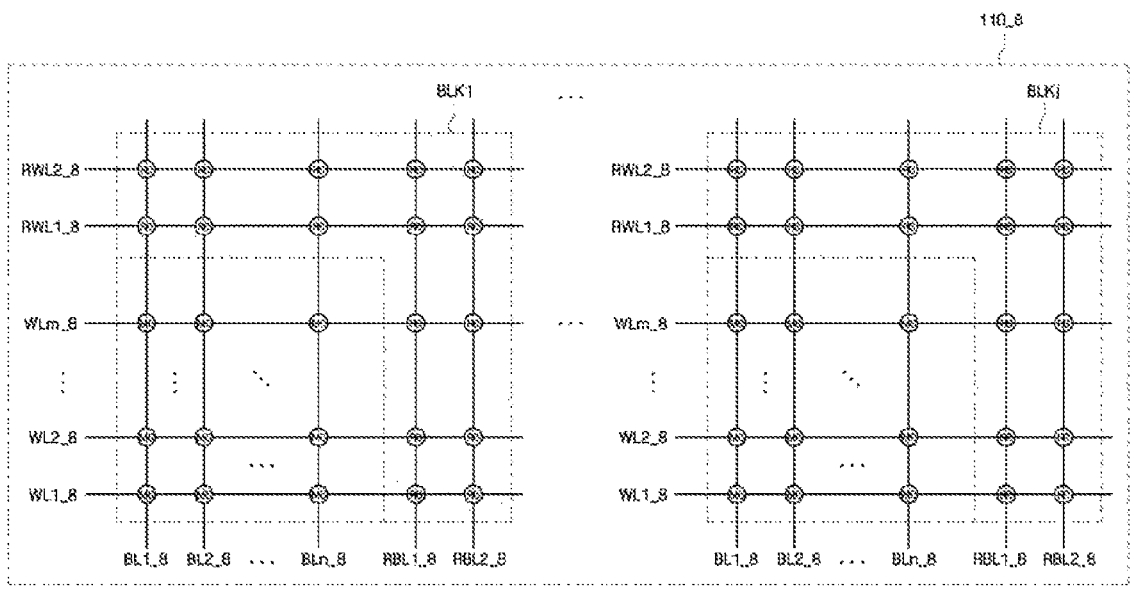
FIG. 4 is a layout view of a memory cell layer that is used in a nonvolatile memory device according to a first embodiment of the present invention.
Figure 5:
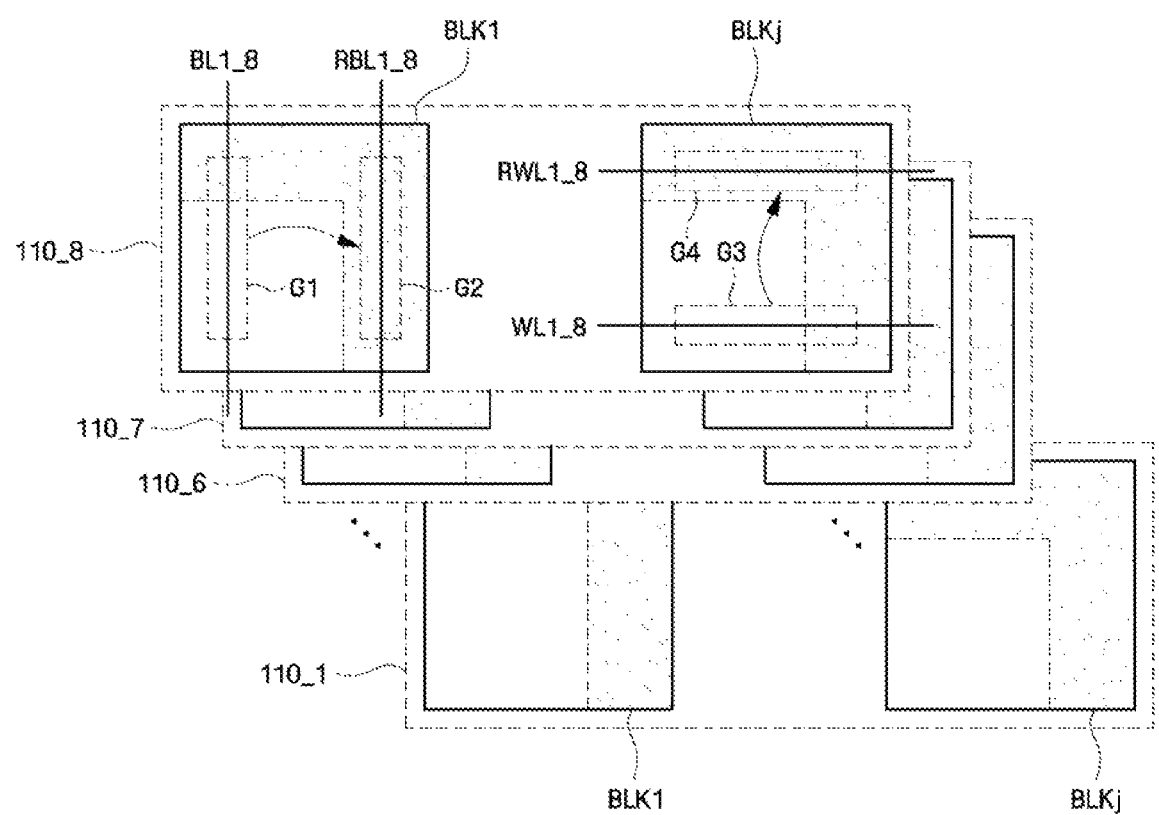
FIG. 5 is a conceptual view illustrating a repair operation of the nonvolatile memory device according to the first embodiment of the present invention.
Figure 6:
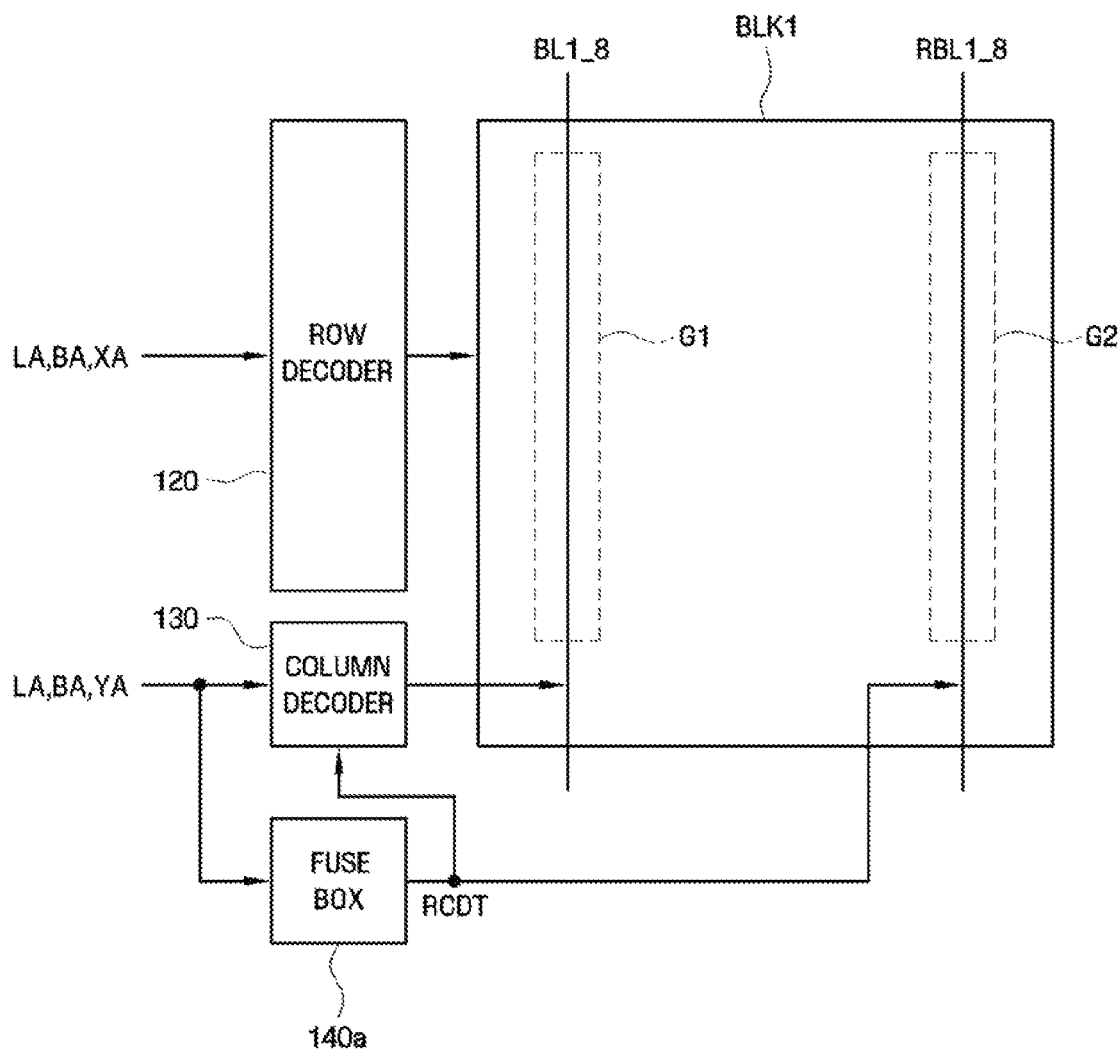
FIG. 6 is a block diagram of the nonvolatile memory device according to the first embodiment of the present invention.
Figure 7:
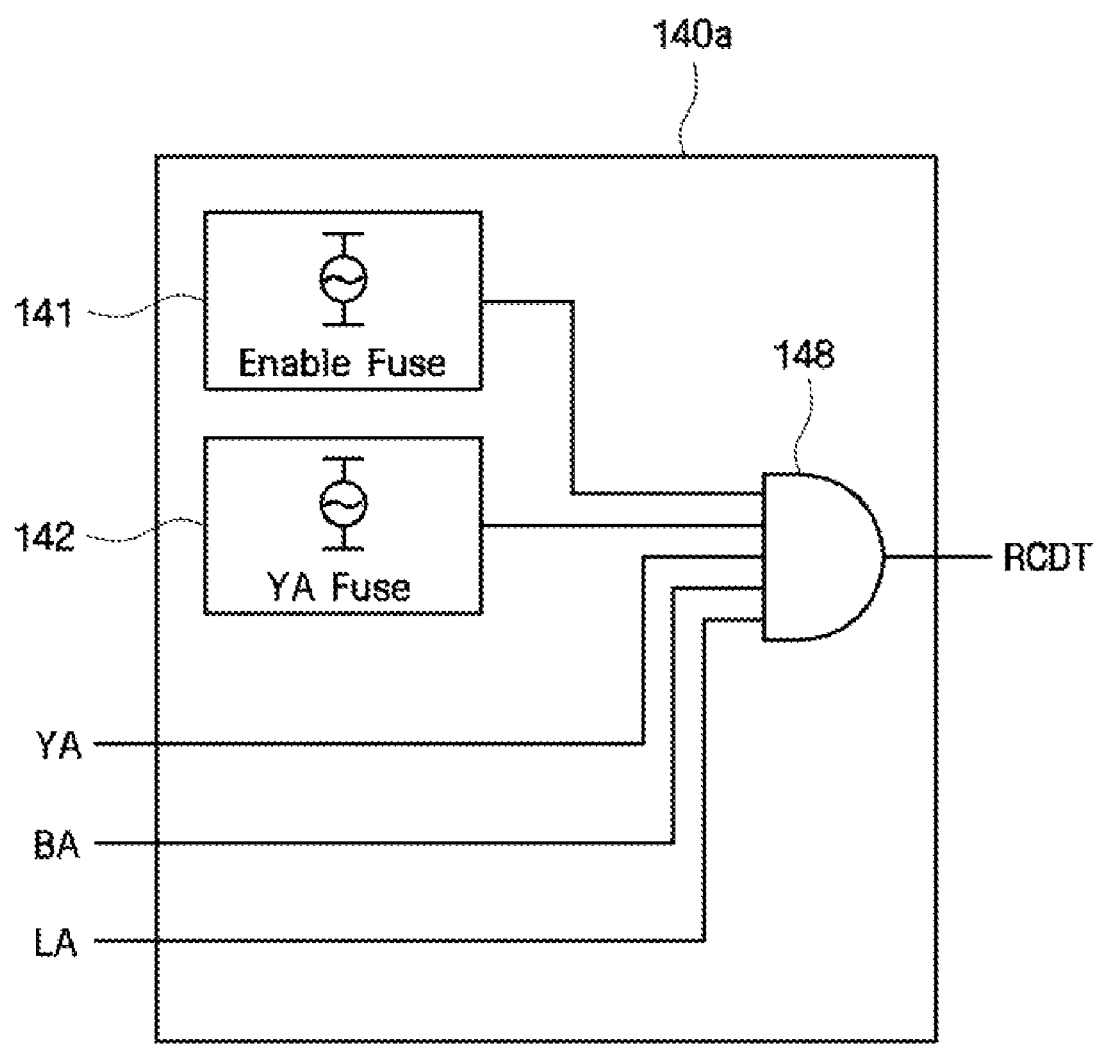
FIG. 7 is a circuit diagram of the fuse box shown in FIG. 6.

FIG. 4 is a layout view of a memory cell layer that is used in the nonvolatile memory device according to the first embodiment of the present invention. FIG. 5 is a conceptual view illustrating a repair operation of the nonvolatile memory device according to the first embodiment of the present invention. FIG. 6 is a block diagram of the nonvolatile memory device according to the first embodiment of the present invention. FIG. 7 is a circuit diagram of the fuse box 140a shown in FIG. 6.

First, referring to FIG. 4, each of the memory cell layers (for example, the memory cell layer 110_8) of the stacked memory cell array 110 includes multiple memory cell blocks BLK1 to BLKj (where j is a natural number). Moreover, each of the memory cell layers (for example, the memory cell layer 110_8) includes multiple nonvolatile memory cells MC and multiple redundancy memory cells RC. Specifically, the nonvolatile memory cells MC are formed at intersections between word lines WL1_8 to WLm_8 and bit lines BL1_8 to BLn_8. Further, the redundancy memory cells RC are formed at intersections between word lines WL1_8 to WLm_8 and redundancy bit lines RBL1_8 and RBL2_8, at intersections between redundancy word lines RWL1_8 and RWL2_8 and bit lines BL1_8 to BLn_8, and at intersections between redundancy word lines RWL1_8 and RWL2_8 and redundancy bit lines RBL1_8 and RBL2_8.

Referring to FIG. 5, the terms used hereinafter will now be defined. The term "memory cell group" means a set of memory cells as a unit of the repair operation. For example, the memory cell group may include multiple memory cells that are coupled to one bit line or one redundancy bit line (see G1 and G2) or multiple memory cells that are coupled to one word line or one redundancy word line (see G3 and G4). The term "defective memory cell group" means a memory cell group that includes at least one defective memory cell.

The nonvolatile memory device can repair the defective memory cell groups G1 and G3 with the redundancy memory cell groups G2 and G4, respectively, in the memory cell blocks BLK1 and BLKj where the defective memory cell groups G1 and G3 are located. That is, since a redundancy memory cell group (for example, a redundancy memory cell group G2) is disposed in each memory cell block (for example, in memory cell block BLK1), the defective memory cell group (for example, a defective memory cell group G1) need not be repaired with a redundancy memory cell group in another memory cell block BLKj.

Specifically, the defective memory cell group G1 in the memory cell block BLK1 of the memory cell layer 110_8 may be repaired with the redundancy memory cell group G2 in the same memory cell block BLK1 of the same memory cell layer 110_8. In this case, the defective memory cell group G1 is repaired with the redundancy memory cell group G2 by replacing the bit line BL1_8 coupled to the defective memory cell group G1 with the bit line RBL1_8 coupled to the redundancy memory cell group G2. Likewise, the defective memory cell group G3 in the memory cell block BLKj of the memory cell layer 110_8 may be repaired with the redundancy memory cell group G4 in the same memory cell block BLKj of the same memory cell layer 110_8. In this case, the defective memory cell group G3 is repaired with the redundancy memory cell group G4 by replacing the word line WL1_8 coupled to the defective memory cell group G3 with the redundancy word line RWL1_8 coupled to the redundancy memory cell group G4.

FIG. 6 is an exemplary block diagram of a circuit that is configured to implement the repair method described with reference to FIG. 5. Referring to FIG. 6, the nonvolatile memory device according to the first embodiment of the present invention may include the memory cell block BLK1 and a repair control circuit. The repair control circuit may include a row decoder 120, a column decoder 130, and a fuse box 140a, each coupled to the memory cell block BLK1.

The row decoder 120 receives and decodes a layer address LA, a block address BA, and a row address XA, and selects a row in the memory cell block BLK1. The column decoder 130 receives and decodes a layer address LA, a block address BA, and a column address YA, and selects a column in the memory cell block BLK1.

The fuse box 140a stores an address corresponding to the defective memory cell group G1 in the memory cell block BLK1 and compares an externally input address and the stored address. When the addresses are the same, the fuse box 140a disables the column decoder 130 and selects the redundancy memory cell group G2. In the first embodiment of the present invention, the fuse box 140a is coupled to the redundancy memory cell group G2. Further, as shown in FIG. 7, the fuse box 140a may include an enable fuse 141 that enables the fuse box 140a, an address fuse 142 that stores the column address YA of the defective memory cell group G1, and a gate 148. The gate 148 performs a predetermined operation on an output signal of the enable fuse 141, an output signal of the address fuse 142, the layer address LA, the block address BA, and the column address YA so as to output a repair control signal RCDT In FIG. 7, an AND gate is exemplified as the gate 148, but the present invention is not limited thereto.

As described above, in the first embodiment of the present invention, the defective memory cell group G1 in the memory cell block BLK1 of the memory cell layer 110_8 is repaired with the redundancy memory cell group G2 in the same memory cell block BLK1 of the same memory cell layer 110_8. Therefore, in the fuse box 140a according to the first embodiment, a block address fuse that stores the block address BA, a layer address fuse that stores the layer address LA, and the like are not required. That is, the number of fuses can be reduced as compared to a more general case.

In FIGS. 5 to 7, the description has been given for the example where the bit line BL1_8 coupled to the defective memory cell group G1 is repaired with the redundancy bit line RBL1_8 coupled to the redundancy memory cell group G2. However, it is likewise possible to repair the word line WL1_8 coupled to the defective memory cell group G3 with the redundancy word line RWL1_8 coupled to the redundancy memory cell group G4.

Hereinafter, referring to FIGS. 8 to 10, a nonvolatile memory device according to a second embodiment of the present invention will be described.

Figure 8:
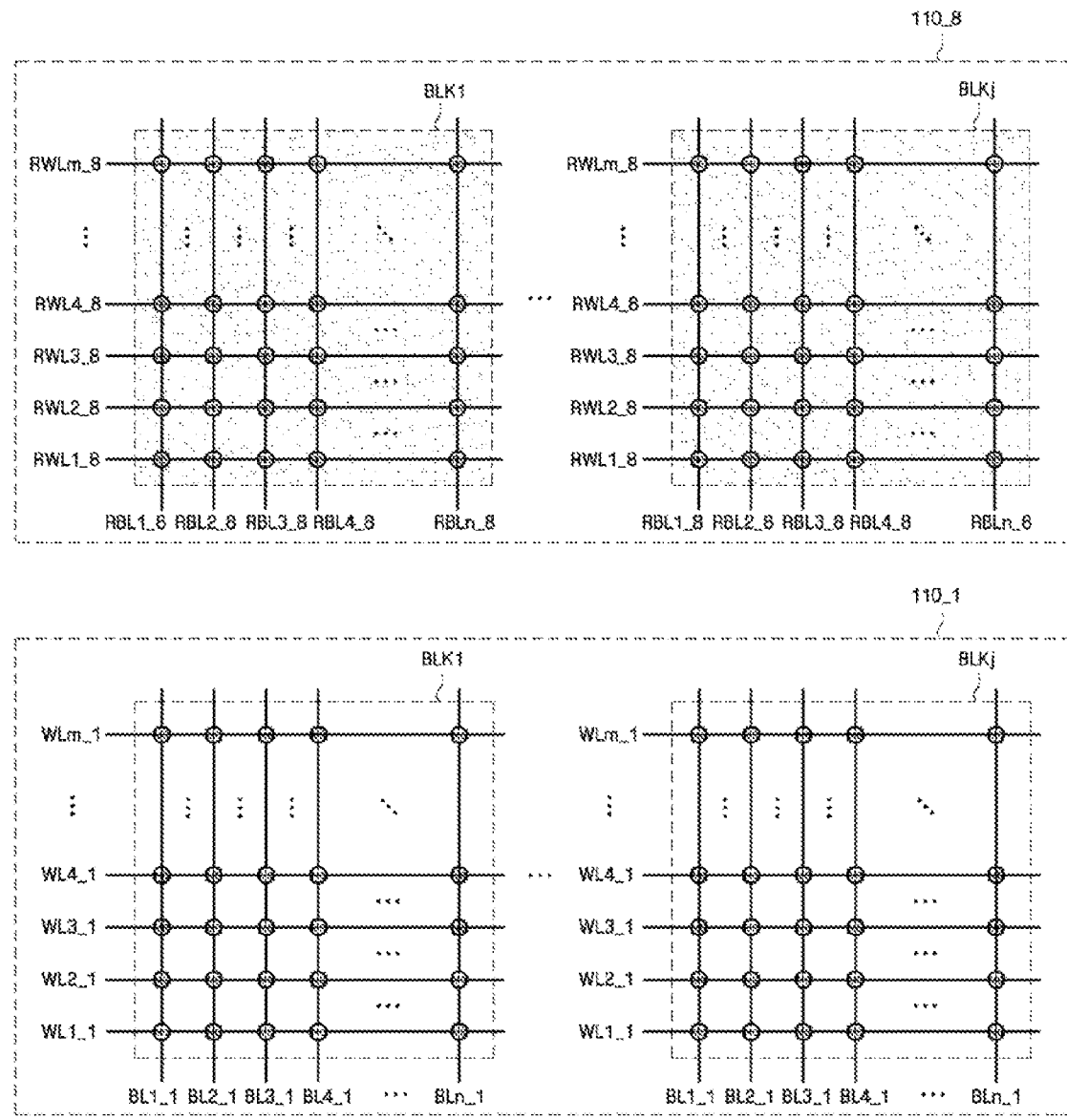
FIG. 8 is a layout view of a memory cell layer that is used in a nonvolatile memory device according to a second embodiment of the present invention.

FIG. 8 is a layout view of a memory cell layer that is used in the nonvolatile memory device according to the second embodiment of the present invention. FIG. 9 is a conceptual view illustrating a repair operation of the nonvolatile memory device according to the second embodiment of the present invention. FIG. 10 is a circuit diagram of a fuse box 140b that is used in the nonvolatile memory device according to the second embodiment of the present invention. In FIGS. 8 to 10, the same parts as those in FIGS. 4 to 7 are represented by the same reference numerals, and the descriptions thereof will be omitted.

Figure 9:
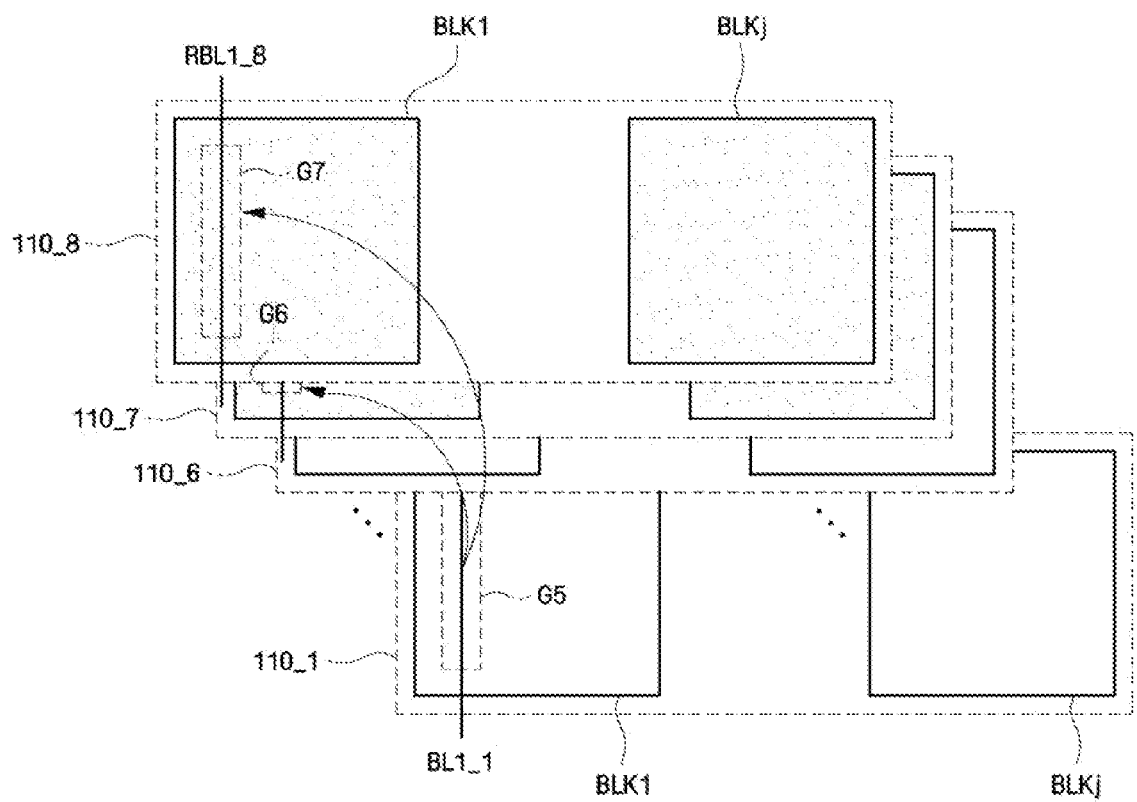
FIG. 9 is a conceptual view illustrating a repair operation of the nonvolatile memory device according to the second embodiment of the present invention.
Figure 10:
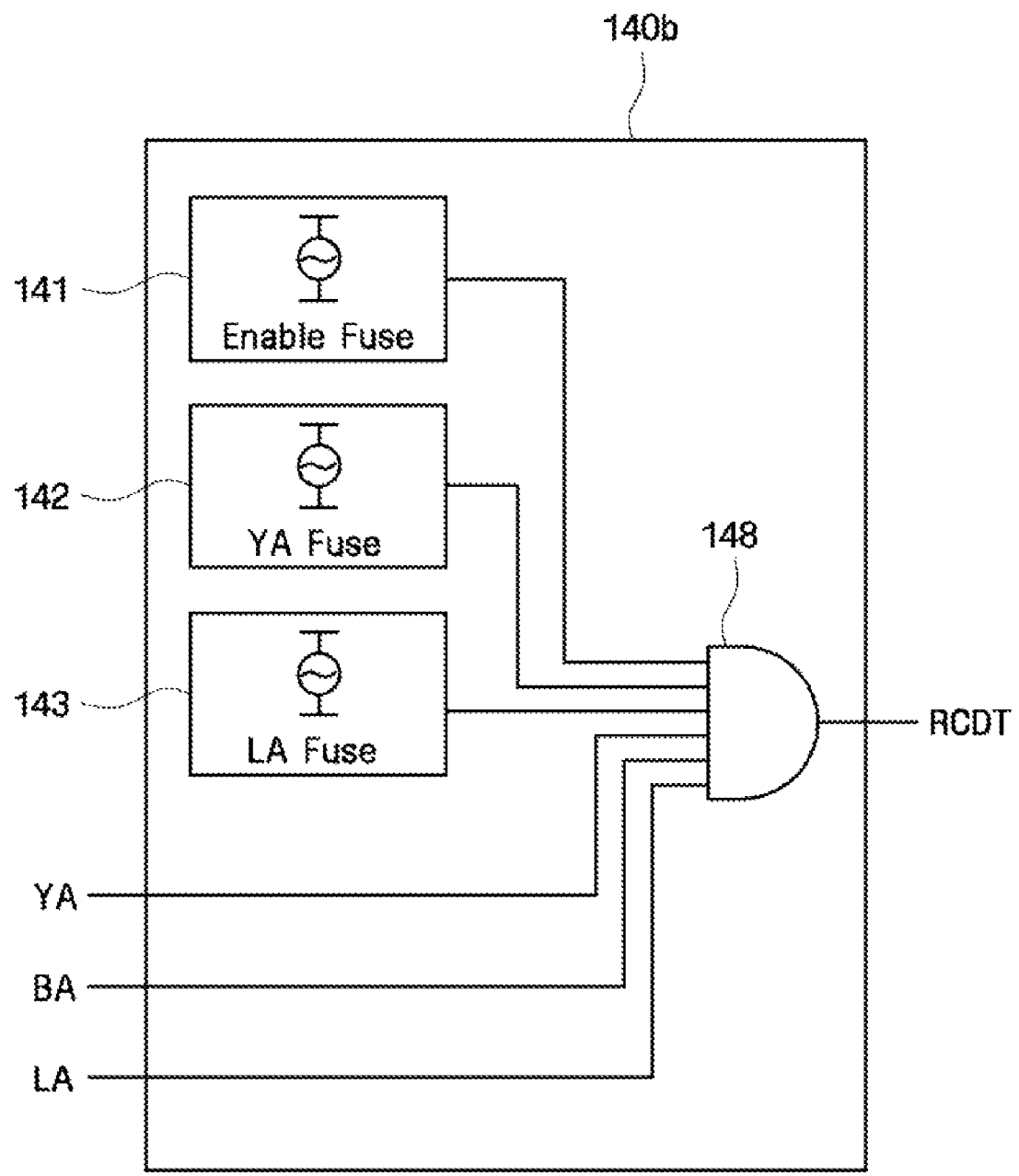
FIG. 10 is a circuit diagram of a fuse box that is used in the nonvolatile memory device according to the second embodiment of the present invention.

First, referring to FIGS. 8 and 9, in the second embodiment of the present invention, a stacked memory cell array 110 includes at least one first memory cell layer (for example, a memory cell layer 110_1) and at least one second memory cell layer (for example, a memory cell layer 110_8). The first memory cell layer 110_1 includes multiple first memory cell blocks BLK1 to BLKj, each of which has multiple nonvolatile memory cells MC coupled between word lines WL1_1 to WLm_1 and bit lines BL1_1 to BLn_1. The second memory cell layer 110_8 has multiple second memory cell blocks BLK1 to BLKj, each of which has multiple redundancy memory cells RC coupled between word lines RWL1_8 to RWLm_8 and redundancy bit lines RBL1_8 to RBLn_8.

Referring to FIG. 9, a repair control circuit (not shown) is configured to repair a defective memory cell group G5 in memory cell block BLK1 of the first memory cell layer 110_1 with a redundancy memory cell group G6 in memory cell block BLK1 of memory cell layer 110_7. Alternatively, the defective memory cell group G5 may be repaired using redundancy memory cell group G7 in memory cell block BLK1 of memory cell layer 110_8. The first memory cell block BLK1 in which the defective memory cell group G5 is located, and the memory cell blocks BLK1 in which the redundancy memory cell groups G6 and G7 are located, may correspond to the same address block.

Since the defective memory cell group G5 and the redundancy memory cell groups G6 and G7 are located in different memory cell layers, the bit line BL1_1 coupled to the defective memory cell group G5 may be repaired with the redundancy bit lines RBL1_7 and RBL1_8 coupled to the redundancy memory cell groups G6 and G7, respectively. Further, a word line coupled to the defective memory cell group G5 may be repaired with word lines coupled to the redundancy memory cell groups G6 and G7.

The repair method described in FIG. 9 can be implemented using a repair control circuit that is substantially similar to the repair control circuit described with reference to FIG. 6, except that fuse box 140a is replaced with a fuse box 140b. An exemplary fuse box 140b is shown in FIG. 10. Referring to FIG. 10, a fuse box 140b includes an enable fuse 141 that enables the fuse box 140b, a layer address fuse 143 that stores a layer address LA corresponding to the first memory cell layer 110_1 in which the defective memory cell group G5 is located, an address fuse 142 that stores a column address YA corresponding to the defective memory cell group G5, and a gate 148. The gate 148 performs a predetermined operation on an output signal of the enable fuse 141, an output signal of the layer address fuse 143, an output signal of the address fuse 142, the layer address LA, a block address BA, and the column address YA so as to output a repair control signal RCDT.

As described above, in the second embodiment of the present invention, since the memory cell block BLK1 in which the defective memory cell group G5 exists and the memory cell block BLK1 in which the redundancy memory cell groups G6 and G7 correspond to the same block address, a block address fuse that stores the block address BA is not required in fuse box 140b.

Hereinafter, referring to FIGS. 11 to 13, a nonvolatile memory device according to a third embodiment of the present invention will be described.

Figure 11:
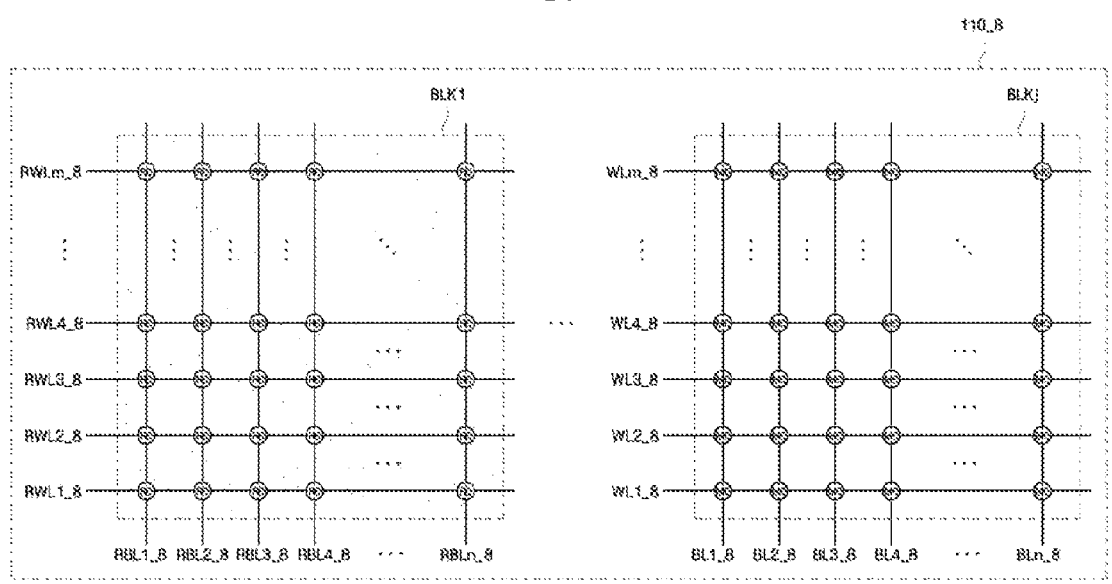
FIG. 11 is a layout view of a memory cell layer that is used in a nonvolatile memory device according to a third embodiment of the present invention.

FIG. 11 is a layout view of a memory cell layer that is used in the nonvolatile memory device according to the third embodiment of the present invention. FIG. 12 is a conceptual view illustrating a repair operation of the nonvolatile memory device according to the third embodiment of the present invention. FIG. 13 is a circuit diagram of a fuse box 140c that is used in the nonvolatile memory device according to the third embodiment of the present invention. In FIGS. 11 to 13, the same parts as those in FIGS. 4 to 7 are represented by the same reference numerals, and the descriptions thereof will be omitted.

Figure 12:
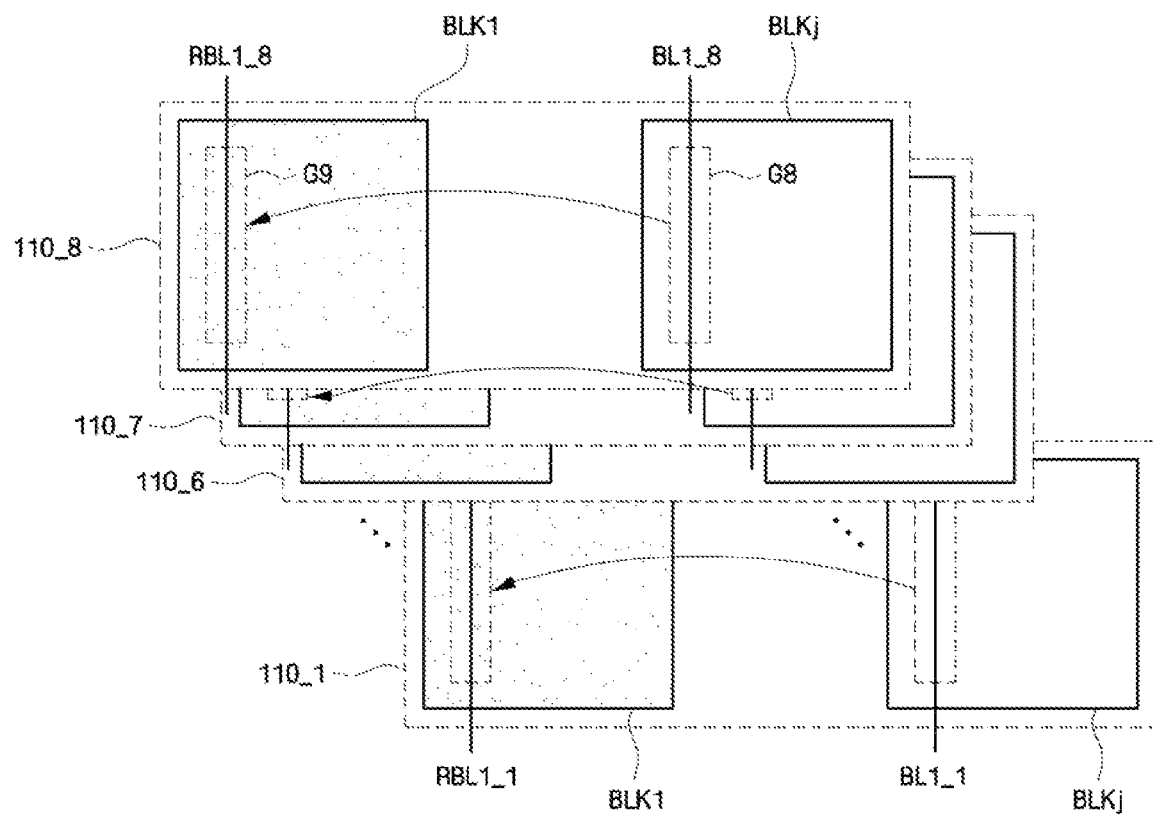
FIG. 12 is a conceptual view illustrating a repair operation of the nonvolatile memory device according to the third embodiment of the present invention.

First, referring to FIGS. 11 and 12, in the third embodiment of the present invention, a stacked memory cell array 110 includes memory cell layers (for example, a memory cell layer 110_8), each of which has at least memory cell block BLKj and at least memory cell block BLK1. Memory cell block BLKj has multiple nonvolatile memory cells MC coupled between word lines WL1_8 to WLm_8 and bit lines BL1_8 to BLn_8. Memory cell block BLK1 has multiple redundancy memory cells RC coupled between redundancy word lines RWL1_8 to RWLm_8 and redundancy bit lines RBL1_8 to RBLn_8.

Referring to FIG. 12, a repair control circuit (not shown) is configured to repair a defective memory cell group G8 in memory cell block BLKj with a redundancy memory cell group G9 in memory cell block BLK1. Memory cell block BLKj and memory cell block BLK1 are located in the same memory cell layer (for example, layer 110_8).

Since the defective memory cell group G8 and the redundancy memory cell group G9 are located in different memory cell blocks, the bit line BL1_8 coupled to the defective memory cell group G8 may be repaired with the redundancy bit line RBL1_8 coupled to the redundancy memory cell group G9. Further, the word line coupled to the defective memory cell group G5 may be repaired with the word line coupled to the redundancy memory cell group G9.

Figure 13:
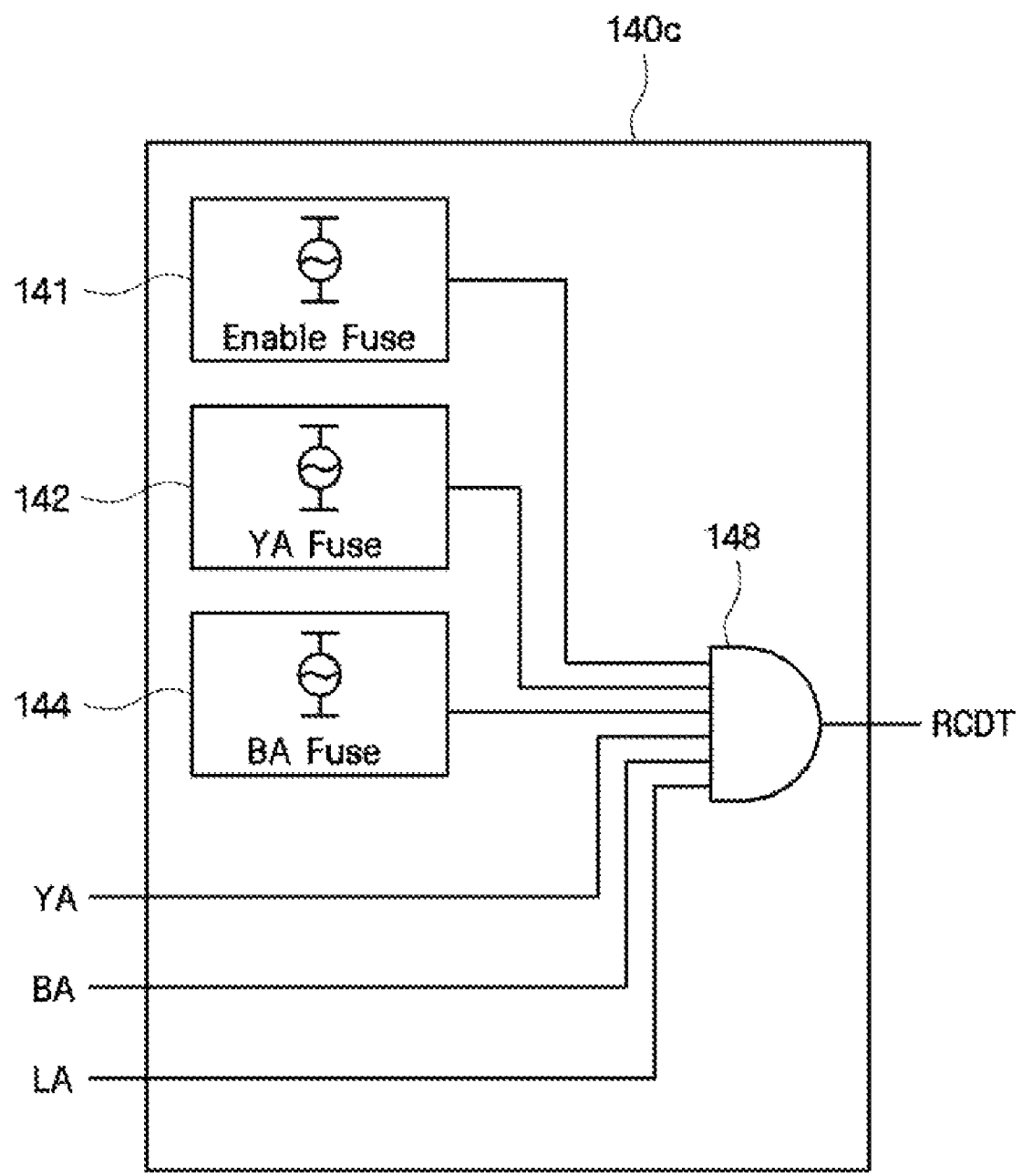
FIG. 13 is a circuit diagram of a fuse box that is used in the nonvolatile memory device according to the third embodiment of the present invention.

The repair method described in FIG. 12 can be implemented using a repair control circuit similar to the one described above with reference to FIG. 6, except that the fuse box 140a is replaced with the fuse box 140c shown in FIG. 13. As compared with the fuse box 140a of FIG. 7, the fuse box 140c in FIG. 13 may further include a block address fuse 144 that stores a block address BA corresponding to the third memory cell block BLKj in which the defective memory cell group G8 is located. However, as described above, in the third embodiment of the present invention, the memory cell block BLKj in which the defective memory cell group G8 exists and the memory cell block BLK1 in which the redundancy memory cell group G9 used to repair the defective memory cell group G8 exists are located in the same memory cell layer 110_8. Therefore, a layer address fuse 143 that stores a layer address LA is not required in fuse box 140c.

Hereinafter, referring to FIGS. 14 and 15, a nonvolatile memory device according to a fourth embodiment of the present invention will be described. The fourth embodiment utilizes the memory cell layer structure illustrated in FIG. 11.

Figure 14:
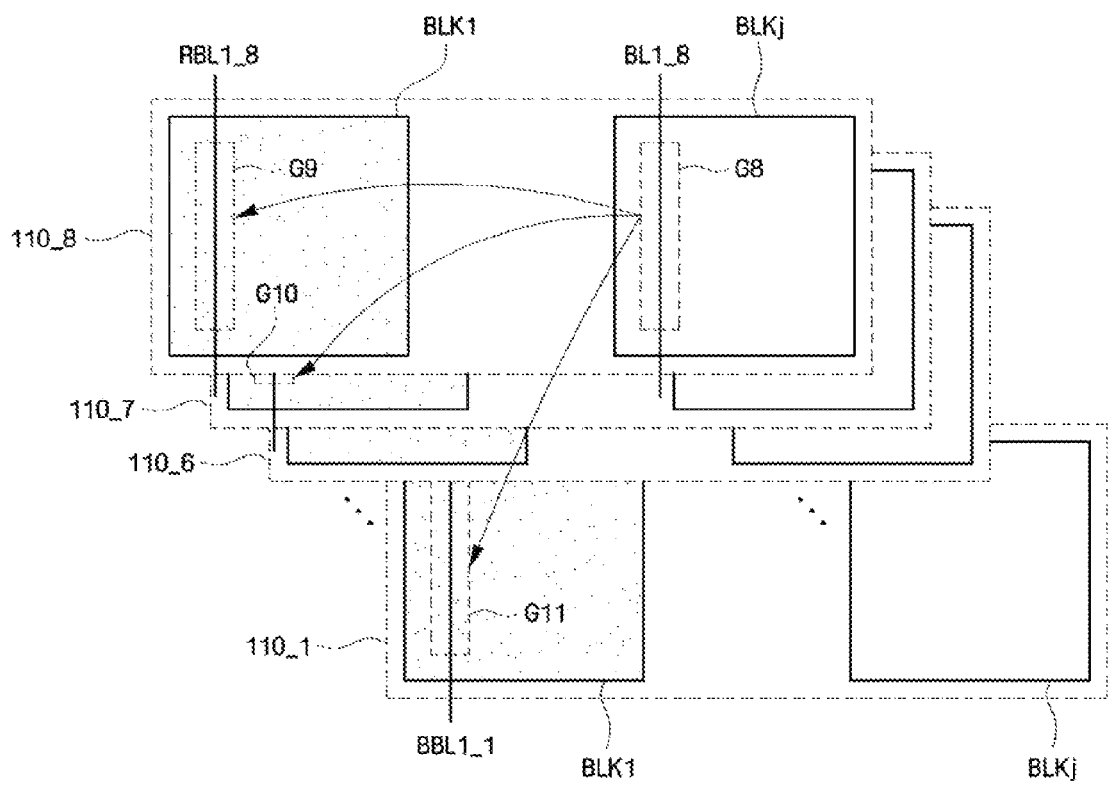
FIG. 14 is a conceptual view illustrating a repair operation of a nonvolatile memory device according to a fourth embodiment of the present invention.

FIG. 14 is a conceptual view illustrating a repair operation of the nonvolatile memory device according to the fourth embodiment of the present invention. FIG. 15 is a circuit diagram illustrating a fuse box 140d that is used in the nonvolatile memory device according to the fourth embodiment of the present invention. In FIGS. 14 and 15, the same parts as those in FIGS. 11 to 13 are represented by the same reference numerals, and the descriptions thereof will be omitted.

Figure 15:
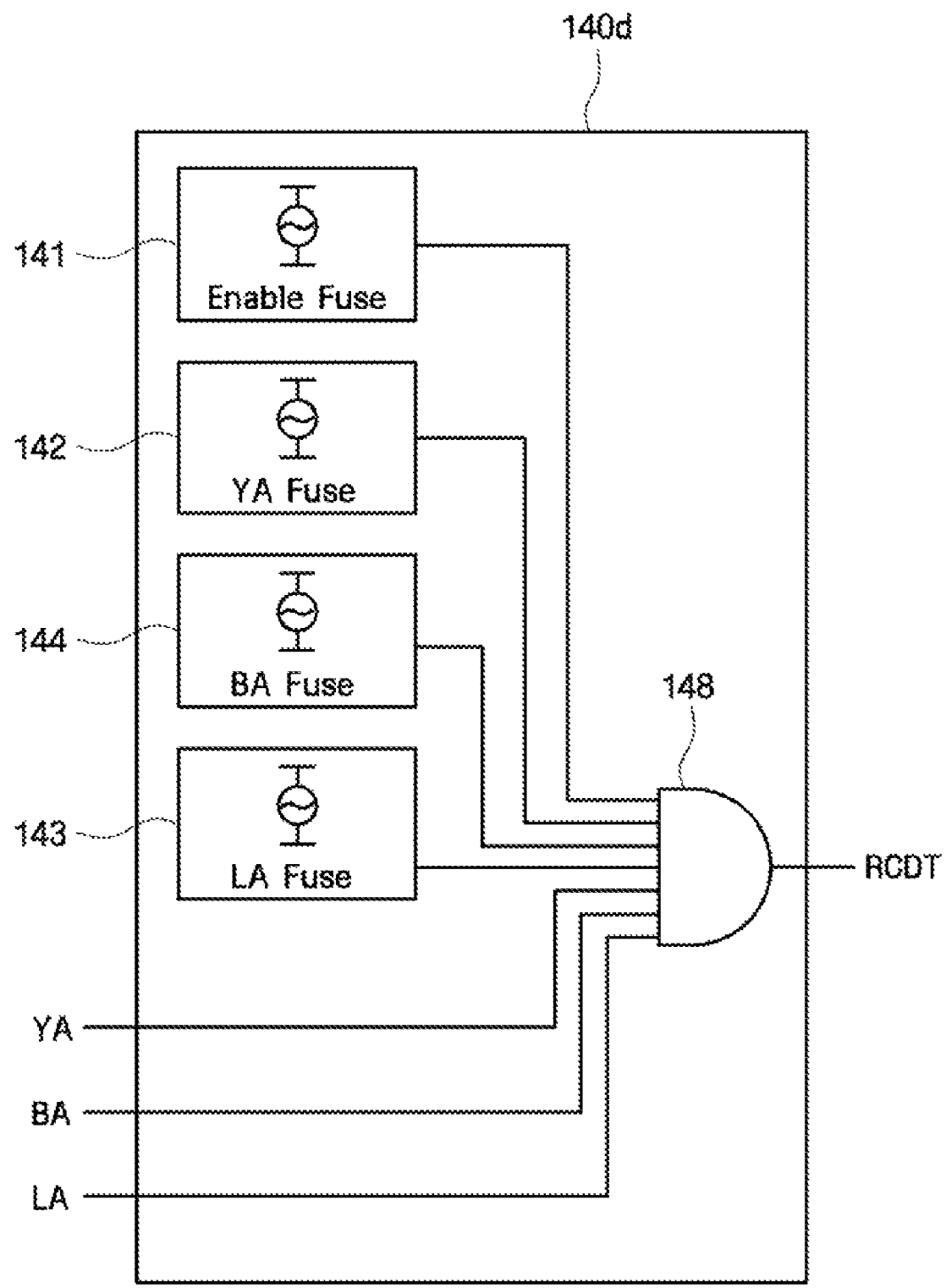
FIG. 15 is a circuit diagram illustrating a fuse box that is used in the nonvolatile memory device according to the fourth embodiment of the present invention.

First, referring to FIGS. 14 and 15, the nonvolatile memory device according to the fourth embodiment of the present invention is different from the nonvolatile memory device according to the third embodiment of the present invention in that a memory cell block BLKj, in which a defective memory cell group G8 exists, and memory cell block BLK1, in which redundancy memory cell groups G9, G10, and G11 used to repair the defective memory cell group G8 exist, can be located in different memory cell layers. For example, as shown in FIG. 14, the defective memory cell group G8 is in layer 110_8, and redundancy memory groups G10 and G11 are in layers 110_7 and 110_1, respectively.

The fourth embodiment utilizes the repair control circuit described above with reference to FIG. 6, except that the fuse box 140a is replaced with the fuse box 140d. As compared with the fuse box 140c in FIG. 13, the fuse box 140d in FIG. 15 further includes a layer address fuse 143 that stores a layer address LA corresponding to one of the memory cell layers 110_1 to 110_8, in which the defective memory cell group G8 is located.

Hereinafter, referring to FIGS. 16 and 17, a nonvolatile memory device according to a fifth embodiment of the present invention will be described.

Figure 16:
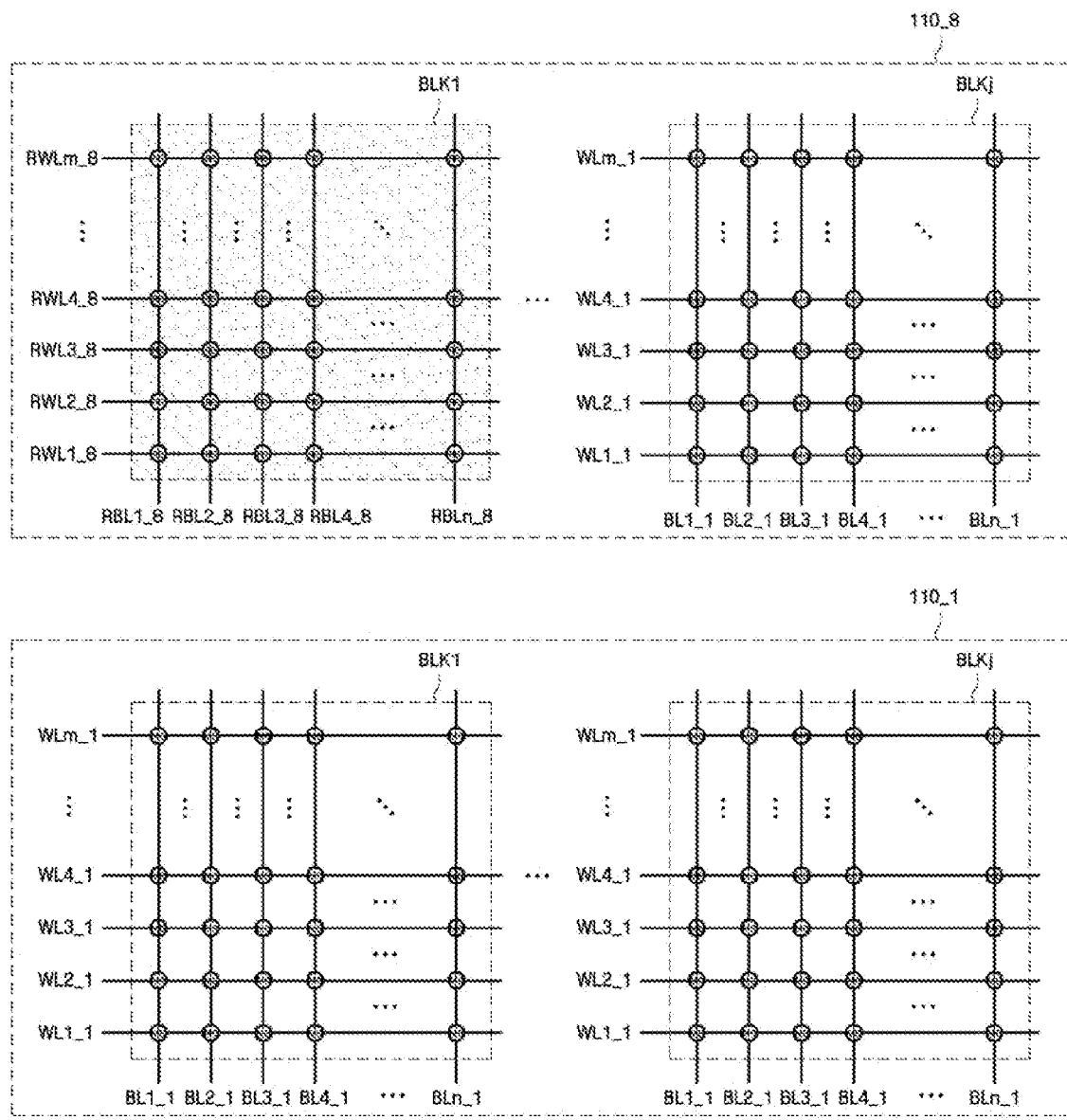
FIG. 16 is a layout view of a memory cell layer that is used in a nonvolatile memory device according to a fifth embodiment of the present invention.

FIG. 16 is a layout view of a memory cell layer that is used in the nonvolatile memory device according to the fifth embodiment of the present invention. FIG. 17 is a conceptual view illustrating a repair operation of the nonvolatile memory device according to the fifth embodiment of the present invention. In FIGS. 16 and 17, the same parts as those in FIGS. 4 to 7 are represented by the same reference numerals, and the descriptions thereof will be omitted.

Figure 17:
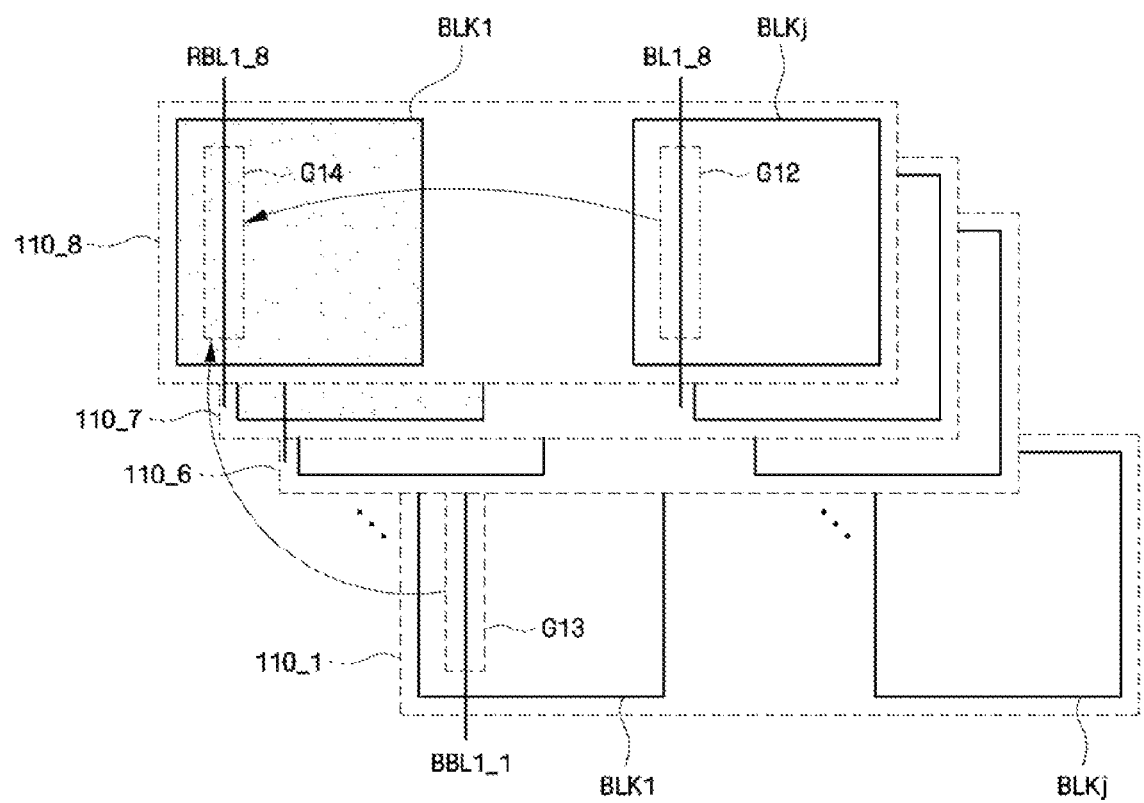
FIG. 17 is a conceptual view illustrating a repair operation of the nonvolatile memory device according to the fifth embodiment of the present invention.

First, referring to FIGS. 16 and 17, in the fifth embodiment of the present invention, a stacked memory cell array 110 has at least a first memory cell layer (for example, 110_1) and at least a second memory cell layer (for example, 110_8). The memory cell layer 110_1 has multiple memory cell blocks BLK1 to BLKj, each of which has multiple nonvolatile memory cells MC. Further, the memory cell layer 110_8 has at least memory cell block BLKj and memory cell block BLK1. In memory cell layer 110_8, the memory cell block BLKj may have multiple nonvolatile memory cells MC, and the memory cell block BLK1 may have multiple redundancy memory cells RC.

Referring to FIG. 17, a repair control circuit (not shown) can repair a defective memory cell group G13 in memory cell block BLK1 of memory cell layer 110_1 or a defective memory cell group G12 in memory cell block BLKj of memory cell layer 110_8 with a redundancy memory cell group G14 in memory cell block BLK1 of memory cell layer 110_8.

The fourth embodiment utilizes the repair control circuit described above with reference to FIG. 6, except that the fuse box 140a is replaced with the fuse box 140d used in the fifth embodiment of the invention and shown in FIG. 15.

Although the present invention has been described in connection with the exemplary embodiments of the present invention, it will be apparent to those skilled in the art that various modifications and changes may be made thereto without departing from the scope and spirit of the present invention. Therefore, it should be understood that the above embodiments are not limitative, but illustrative in all aspects.

The above-described nonvolatile memory device using the resistance material includes the repairable stacked memory cell array, thereby improving yield of the nonvolatile memory device.

What is claimed is:

1. A nonvolatile memory device comprising:
   a stacked memory cell array having a plurality of memory cell layers stacked in a vertical direction,
   wherein each one of the plurality of memory cell layers comprises a plurality of memory cell blocks, and
   each one of the plurality of memory cell blocks comprises a plurality of memory cell groups and a plurality of redundancy memory cell group; and
   a repair control circuit coupled to the stacked memory cell array and configured to repair within a respective one of the plurality of memory cell blocks of a memory cell layer a defective memory cell group with a selected one of the plurality of redundancy memory cell groups.

2. The nonvolatile memory device of claim 1, wherein the repair control circuit includes a fuse box coupled to the selected one of the plurality of redundancy memory cell groups, the fuse box comprising:
   an enable fuse configured to enable the fuse box; and
   an address fuse configured to store one of a column address and a row address corresponding to the defective memory cell group.

3. The nonvolatile memory device of claim 1, wherein each one of the plurality of memory cell groups including the defective memory cell group is a collection of memory cells commonly connected to a word line, and each one of the plurality of redundancy memory cell groups is a collection of memory cells commonly connected to a redundancy word line.

4. The nonvolatile memory device of claim 3, wherein the repair control circuit includes a fuse box coupled to the selected one of the plurality of redundancy memory cell groups, the fuse box including:
   an enable fuse configured to enable the fuse box;
   a layer address fuse configured to store a layer address corresponding to one of the plurality of memory cell layers in which the defective memory cell group is located; and
   an address fuse configured to store a row address corresponding to the defective memory cell group.

5. The nonvolatile memory device of claim 1, wherein each one of the plurality of memory cell groups including the defective memory cell group is a collection of memory cells commonly connected to a bit line, and each one of the plurality of redundancy memory cell groups is a collection of memory cells commonly connected to a redundancy bit line.

6. The nonvolatile memory device of claim 5, wherein the repair control circuit includes a fuse box coupled to the selected one of the plurality of redundancy memory cell groups, the fuse box including:
   an enable fuse configured to enable the fuse box;
   a layer address fuse configured to store a layer address corresponding to one of the plurality of memory cell layers in which the defective memory cell group is located; and
   an address fuse configured to store a column address corresponding to the defective memory cell group.

7. The nonvolatile memory device of claim 1, wherein at least one of plurality of memory cell groups is a resistive memory cell group.

8. The nonvolatile memory device of claim 1, wherein each one of the plurality of memory cell layers has a cross point structure.

9. A nonvolatile memory device comprising:
   a stacked memory cell array having a plurality of memory cell layers stacked in a vertical direction and comprising:
      a first memory cell layer comprising a plurality of memory cell blocks, wherein each one of the plurality of memory cell blocks comprises only a plurality of memory cell groups, the plurality of memory cell groups including a defective memory cell group, and
      a second memory cell layer comprising a plurality of memory cell blocks, wherein each one of the plurality of memory cell blocks includes only a plurality of redundancy memory cell groups; and
   a repair control circuit coupled to the stacked memory cell array and configured to repair the defective memory cell group of the first memory cell layer with a selected one of the plurality of redundancy memory cell groups of the second memory cell layer.

10. The nonvolatile memory device of claim 9, wherein the repair control circuit includes a fuse box coupled to the selected one of the plurality of redundancy memory cell groups, the fuse box comprising:
    an enable fuse configured to enable the fuse box;
    a layer address fuse configured to store an address corresponding to the first memory cell layer; and
    an address fuse configured to store one of a column address and a row address corresponding to the defective memory cell group.

11. The nonvolatile memory device of claim 9, wherein each one of the plurality of memory cell groups including the defective memory cell group is a collection of memory cells commonly connected to a word line, and each one of the plurality of redundancy memory cell groups is a collection of memory cells commonly connected to a redundancy word line.

12. The nonvolatile memory device of claim 9, wherein each one of the plurality of memory cell groups including the defective memory cell group is a collection of memory cells commonly connected to a bit line, and each one of the plurality of redundancy memory cell groups is a collection of memory cells commonly connected to a redundancy bit line.

13. A nonvolatile memory device comprising:
a stacked memory cell array having a plurality of memory cell layers stacked in a vertical direction,
wherein each one of the plurality of memory cell layers comprises a plurality of memory cell blocks,
one of the plurality of memory cell blocks comprising only a plurality of memory cell groups, the plurality of memory cell groups including a defective memory cell group, and
another one of the plurality of memory cell blocks comprising only a plurality of redundancy memory cell groups; and
a repair control circuit coupled to the stacked memory cell array and configured to repair the defective memory cell group with a selected one of the plurality of redundancy memory cell groups.

14. The nonvolatile memory device of claim 13, wherein the repair control circuit includes a fuse box coupled to the selected one of the plurality of redundancy memory cell groups, the fuse box comprising:
an enable fuse configured to enable the fuse box;
a block address fuse configured to store a block address corresponding to the one the plurality of memory cell blocks; and
an address fuse configured to store one of a column address and a row address corresponding to the defective memory cell group.

15. The nonvolatile memory device of claim 13, wherein each one of the plurality of memory cell groups including the defective memory cell group is a collection of memory cells commonly connected to a word line, and each one of the plurality of redundancy memory cell groups is a collection of memory cells commonly connected to a redundancy word line.

16. The nonvolatile memory device of claim 13, wherein each one of the plurality of memory cell groups including the defective memory cell group is a collection of memory cells commonly connected to a bit line, and each one of the plurality of redundancy memory cell groups is a collection of memory cells commonly connected to a redundancy bit line.

17. A nonvolatile memory device comprising:
a stacked memory cell array having a plurality of memory cell layers stacked in a vertical direction and comprising:
a first memory cell layer comprising a plurality of memory cell blocks, wherein each one of the plurality of memory cell blocks comprises only a plurality of memory cell groups, the plurality of memory cell groups including a defective memory cell group, and
a second memory cell layer comprising a plurality of memory cell blocks, at least one of the plurality of memory cell blocks being a redundancy memory cell block including only a plurality of redundancy memory cell groups; and
a repair control circuit coupled to the stacked memory cell array and configured to repair the defective memory cell group with a selected one of the plurality of redundancy memory cell groups.

18. The nonvolatile memory device of claim 17, wherein the repair control circuit includes a fuse box coupled to the selected one of the plurality of redundancy memory cell groups, the fuse box comprising:
an enable fuse configured to enable the fuse box;
a layer address fuse configured to store an address corresponding to the first memory cell layer; and
an address fuse configured to store one of a column address and a row address corresponding to the defective memory cell group.

19. The nonvolatile memory device of claim 17, wherein each one of the plurality of memory cell groups including the defective memory cell group is a collection of memory cells commonly connected to a word line, and each one of the plurality of redundancy memory cell groups is a collection of memory cells commonly connected to a redundancy word line.

20. The nonvolatile memory device of claim 17, wherein each one of the plurality of memory cell groups including the defective memory cell group is a collection of memory cells commonly connected to a bit line, and each one of the plurality of redundancy memory cell groups is a collection of memory cells commonly connected to a redundancy bit line.

* * * * *